United States Patent
Ma et al.

(10) Patent No.: US 6,572,923 B2
(45) Date of Patent: Jun. 3, 2003

(54) ASYMMETRIC ORGANOCYCLOSILOXANES AND THEIR USE FOR MAKING ORGANOSILICON POLYMER LOW-K DIELECTRIC FILM

(75) Inventors: Ce Ma, Apex, NC (US); Qing Min Wang, Edison, NJ (US)

(73) Assignee: The BOC Group, Inc., Murray Hill, NJ (US)

(*) Notice: Subject to any disclaimer, the term of this patent is extended or adjusted under 35 U.S.C. 154(b) by 0 days.

(21) Appl. No.: 10/042,889

(22) Filed: Jan. 9, 2002

(65) Prior Publication Data

US 2002/0132408 A1 Sep. 19, 2002

Related U.S. Application Data

(60) Provisional application No. 60/261,451, filed on Jan. 12, 2001.

(51) Int. Cl.[7] .............................................. C23C 14/16

(52) U.S. Cl. ...................... 427/255.27; 427/96; 427/99; 427/255.18; 427/255.23; 428/447; 438/778; 438/780; 556/460; 528/37

(58) Field of Search .......................... 528/37; 556/460, 556/400; 428/447; 427/96, 99, 255.18, 255.23, 255.27; 438/778, 780

(56) References Cited

U.S. PATENT DOCUMENTS

| | | | | |
|---|---|---|---|---|
| 4,539,418 A | * | 9/1985 | Takago et al. | 556/451 |
| 4,599,440 A | * | 7/1986 | Watanabe et al. | 556/460 |
| 5,231,058 A | * | 7/1993 | Maeda et al. | 438/784 |
| 5,239,085 A | * | 8/1993 | Enami et al. | 549/215 |
| 5,290,736 A | | 3/1994 | Sato et al. | |
| 5,334,454 A | * | 8/1994 | Caporiccio et al. | 428/412 |
| 5,403,945 A | * | 4/1995 | Kishita et al. | 556/460 |
| 5,412,055 A | | 5/1995 | Loo | |
| 5,629,439 A | | 5/1997 | Bank et al. | |
| 5,780,661 A | | 7/1998 | Iwata et al. | |
| 5,786,493 A | | 7/1998 | Rauleder et al. | |
| 5,914,420 A | * | 6/1999 | Buese et al. | 556/448 |
| 6,068,884 A | * | 5/2000 | Rose et al. | 427/255.6 |
| 6,160,150 A | * | 12/2000 | Krahnke et al. | 556/451 |
| 6,441,491 B1 | * | 8/2002 | Grill et al. | 257/759 |

FOREIGN PATENT DOCUMENTS

EP 418568 A2 * 3/1991 ............. C07F/7/21

OTHER PUBLICATIONS

Misako Imachi, Jun Nakagawa and Michiro Hayashi, "Microwave Spectrum, Structure, Dipole Moment and Internal Rotation of Allylsilane," Journal of Molecular Structure, 102 (1983) 403–412.

Michio Niwano and Nobuo Miyamoto, "UV Light–Induced Decomposition and Polymerization Of Organosilicon Compounds," Research Institute of Electrical Communication, Tohoku University, 2–1–1 Katahira, Aoba–ku, Sendai, Miyagi 980–3577, Review of Laser Engineering, vol. 26, No. 6; Jun. 1998; pp. 463–467.

Mauricio F. Gozzi, M. Do Carmo Gonçalves, I. Valéria P. Yoshida, "Near–Stoichiometric Silicon Carbide From A Poly(Methylsilylene)/Tetra–Allylsilane Mixture," Journal of Materials Science 34 (1999) 155–159.

Sing–Pin Tay, J.P. Ellul, Susan B. Hewitt, N.G. Tarr, A.R. Boothroyd, "Evaluation of Silicon Carbide Formed with a Single Precursor of Di–tert–Butysilane," Materials Research Society Symposium Proceedings, vol. 242, pp. 525–530, 1992 Materials Research Society.

S. B. Hewitt, S.–P. Tay, and N. G. Tarr and A. R. Boothroyd, "Silicon Carbide Emitter Diodes by LPCVD (low–pressure chemical vapour deposition) Using di–tert–butylsilane," Can. J. Phys. vol. 70, 1992, pp. 946–948.

A.C. Dillon, M.B. Robinson, M.Y. Han and S.M. George, "Decomposition of Alkylsilanes on Silicon Surfaces Using Transmission FTIR Spectroscopy," Mat. Res. Soc. Symp. Proc. vol. 222, 1991, Materials Research Society, pp. 213–218.

R.A. Levy, J.M. Grow, Y. Yu, K.T. Shih, "Plasma Enhanced Chemical Vapor Deposition of Si–N–C–H Films from Environmentally Benign Organosilanes," Elsevier, Materials Letter 24 (1995) 47–52.

Roland A. Levy and James M. Grow, "LPCVD of Silicon Carbide Films from the Organosilanes Diethylsilane and Di–T–Butylsilane," Mat. Res. Soc. Symp. Proc. vol. 306, 1993 Materials Research Society, pp. 219–228.

James M. Grow, "Growth Kinetics and Properties of Silicon Carbide Films Synthesized by Low Pressure Chemical Vapor Deposition," Electrochemcial Society Proceedings, vol. 96–2, pp. 60–72.

Vladimir S. Mastryukov, Matthias Hofmann and Henry F. Schaefer III, "Structure and Conformations of Cyclopentasilane, $Si_5H_{10}$," J. Phys. Chem. A 1999, 103, pp. 5581–5584.

F. Höfler, G. Bauer and E. Hengge, "Schwingungsspektrum und Kraftkonstanten des Cyclopentasilans," Spectrochimica Acta., vol. 32A, pp. 1435–1441, Pergamon Press 1976.

Gábor Magyarfalvi, Peter Pulay, "Chemical Shift Anisotropies in Silicon Containing Three–Membered Rings. An Ab Initio Study," Elsevier, Chemical Physics Letters 241 (1995) 393–398.

(List continued on next page.)

Primary Examiner—Robert Dawson
Assistant Examiner—Marc S Zimmer
(74) Attorney, Agent, or Firm—Philip H. Von Neida; Salvatore P. Pace

(57) ABSTRACT

Methods for synthesizing extra low-k CVD precursors and forming extra low-k dielectric films on the surfaces of semiconductors wafers and integrated circuits are disclosed. An asymmetric organocyclosiloxane compound is applied to the surface where it will react with and form a film that will have a dielectric constant, k, from 2.0 to 2.5.

19 Claims, No Drawings

OTHER PUBLICATIONS

Michael C. Kwan and Karen K. Gleason, "Pyrolytic CVD of Poly(organosiloxane) Thin Films," Communications, Chemical Vapor Deposition 1997, 3, No. 6, pp. 299–301.

C.S. Pai, "High Quality Voids Free Oxide Deposition," Elsevier, Materials Chemistry and Physics, 44 (1996) 1–8.

Takeshi Furusawa, Noriyuki Sakuma, Daisuke Ryuzaki, Seiichi Kondo, Ken–ichi Takeda, Shun–taro Machida and Kenji Hinode, "Simple, Reliable Cu/low–k Interconnect Integration Using Mechanically–strong Low–k Dielectric Materials: Silicon–oxycarbide," IEEE 2000, pp. 222–224.

Ji–Mao Lin, Ai–Min Zhou, Hui Zhang and Ai–You Hao, "Synthesis of Dialkoxydimethylsilanes and 2,2–Dimethyl–1,3–Dioxa–1–Silacyclo Compounds," Synthetic Communications, 27(14), 2527–2532 (1997).

Catrin Lorenz and Ulrich Schubert, "An Efficient Catalyst for the Conversion of Hydrosilanes to Alkoxysilanes," Chem. Ber. 1995, 128, 1267–1269.

Arun R. Srivatsa, Carlos L. Ygartua, Steve Weinzierl, Water Johnson, Torsten Kaack, "Low–k Dielectric Metrology," Solid State Technology, Aug. 2000, pp. 55–66.

Nedogrei et al., Zh. Prikl Khim, 1988, 61(4), 937–940.

* cited by examiner

ASYMMETRIC ORGANOCYCLOSILOXANES AND THEIR USE FOR MAKING ORGANOSILICON POLYMER LOW-K DIELECTRIC FILM

This application claims priority from Provisional Patent Application Serial No. 60/261,451 filed Jan. 12, 2001.

FIELD OF THE INVENTION

The present invention provides for methods for forming a low-k dielectric film on semiconductors wafers or integrated circuits using an asymmetric organocyclosiloxane compound as a CVD extra low-k dielectric precursor.

BACKGROUND OF THE INVENTION

The increase in semiconductor design integration by feature size reduction has resulted in increased levels of interconnect and increased utilization of dielectric low-k thin films. The dielectric film is used as insulation around metal lines of a device, and it contributes to the RC time constant that controls the device speed. As the semiconductor industry has strived to reduce resistance (R) by the use of copper metallization, the push to the use of low-k dielectrics is to reduce capacitance (C). Reducing capacitance by lowering the dielectric constant k to the inter and intra level dielectric (ILD) film can improve device performance by reducing the RC time delay, decreasing the cross talk between adjacent metal lines and lowering the power dissipation.

Traditionally, the material of choice for the ILD is silicon dioxide ($SiO_2$) which can be prepared using silane, disilane or siloxane precursors in an oxidizing environment. The most popular deposition techniques for depositing ILD are chemical vapor deposition (CVD), low temperature plasma-enhanced CVD (PECVD), or high-density plasma CVD (HDPCVD). However, the dielectric constant of the deposited $SiO_2$ is relatively high at 4.0.

As the semiconductor industry moves to smaller width metal lines, low-k materials must have smaller dielectric constants. Industry publications have indicated that low-k materials with k values from 2.7 to 3.5 would be needed for 150 and 130 nm technology modes. When the industry moves to 100 nm technology and dimensions below that in the future, extra low-k (ELK) materials having a k value from 2.2 to 2.6 and ultra low-k (ULK) materials with a k value less than 2.2 will be necessary.

The semiconductor industry has developed several low-k materials to replace silicon dioxide that are inorganic, organic or hybrid materials. These materials can be deposited by either chemical vapor deposition (CVD) or spin-on deposition (SOD) methods. The CVD technique utilizes existing vacuum tools for depositing $SiO_2$ that include lower temperature plasma enhanced CVD (PECVD) and high density plasma CVD (HDP-CVD). The SOD method uses spin coaters that have shown better extendibility to ELK or ULK by introducing pores in nanometer sizes. Newer materials such as fluorossilicate glass (FSG), carbon or carbon fluorine based films and carbon-doped $SiO_2$ utilize CVD techniques. Materials such as polyimide, hydrogen silsesquioxane (HSQ) and polyarylene ethers can be deposited using SOD techniques.

As such, a number of technologies to provide lower dielectric constant CVD materials have been demonstrated in the 3.5 to 2.6 range. However, there are far fewer alternatives for k values at or below 2.5 for CVD materials in ELK/ULK applications. The present invention provides for new materials for use as extra low dielectric CVD precursors in extra low-k CVD materials for the semiconductor industry.

Given the desires of the semiconductor industry for lower k value materials, new low-k CVD materials are being sought. The present invention provides a novel class of compounds useful for forming a film on a semiconductor or integrated circuit by acting as a precursor for the film formed when the compound is applied.

SUMMARY OF THE INVENTION

Asymmetric organocyclosiloxane compounds are used as precursors for forming a low-k dielectric film on the surface of semiconductor wafers and integrated circuits. The resultant dielectric film formed will be an organosilicon polymer film on the surface of the device, which will have low-k dielectric properties.

The asymmetric organocyclosiloxane compounds are those having the formula $(-SiO-)_n R_{(2n-m)} R'_m$ where (—SiO—) represents a cyclic siloxane ring; n is the number of (—SiO—) units in the ring, which is 3 or higher; R is an acyclic alkyl-containing hydrocarbon from $C_1$ to $C_7$; R' is H, a vinyl group, or a cyclohexyl group, and m is 1 or higher with the stipulation that the molecule remains asymmetric. In some cases, the two groups, R and R', are linked together to form a cyclic alkyl group.

The asymmetric organocyclosiloxane compounds are precursors to the film formed and will react with the surface of the semiconductor wafers or integrated circuits to form the extra low-k dielectric film having a dielectric constant less than 2.5.

DETAILED DESCRIPTION OF THE INVENTION

The present invention provides for a method of fabricating a dielectric film on a semiconductor or integrated circuit wherein the dielectric film will be a low-k film comprising applying to the surface of the semiconductor or integrated circuit an asymmetric organocyclosiloxane compound.

The asymmetric organocyclosiloxane compound has the general formula:

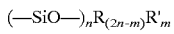

wherein (—SiO—) is a cyclic siloxane ring; n is 3 or higher; R is an acyclic alkyl-containing hydrocarbon from $C_1$ to $C_7$; R' is H, a vinyl group, or a cyclohexyl group; and m is 1 or greater given that m is chosen such that the resulting molecule remains asymmetric. In some cases, the two groups, R and R', are linked together to form a cyclic alkyl group.

Representative asymmetric organocyclosiloxane compounds include but are not limited to 2-vinyl-2,4,4,6,6-pentamethylcyclotrisiloxane (#1), 2-vinyl-4,4,6,6-tetramethylcyclotrisiloxane (#2), 2-vinyl-2,4,6-trimethylcyclotrisiloxane (#3), 2-vinyl-4,6-dimethylcyclotrisiloxane (#4), 2,6-divinyl-4,4-dimethylcyclotrisiloxane (#5), 2,6-divinyl-4-methylcyclotrisiloxane (#6), 2-cyclohexyl-2,4,4,6,6-pentamethylcyclotrisiloxane (#7), 2-cyclohexyl-4,6-dimethylcyclotrisiloxane (#8), 2-cyclopentamethylene-4,4,6,6-tetramethyltrisiloxane (#9), 2-cyclopentamethylene-4,6-dimethyltrisiloxane (#10), 2-cyclotetramethylene-4,4,6,6-tetramethyltrisiloxane (#11), and 2-cyclotetramethylene-4,6-dimethyltrisiloxane (#12), as shown in Figure 1.

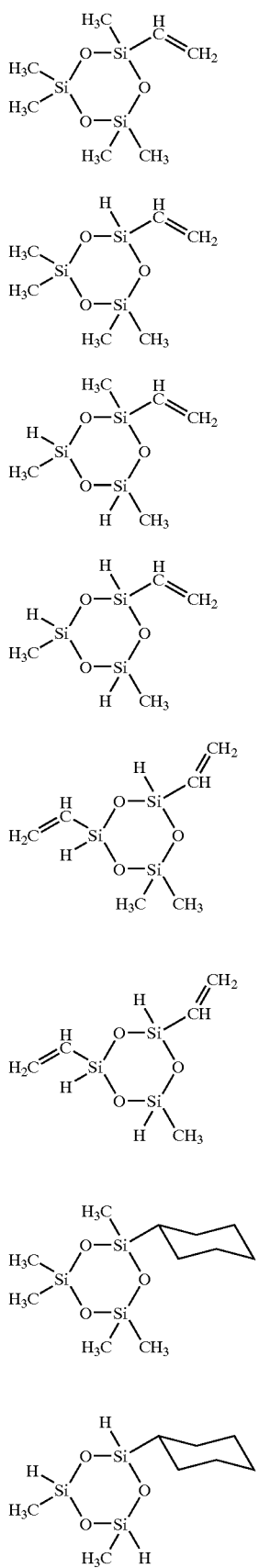

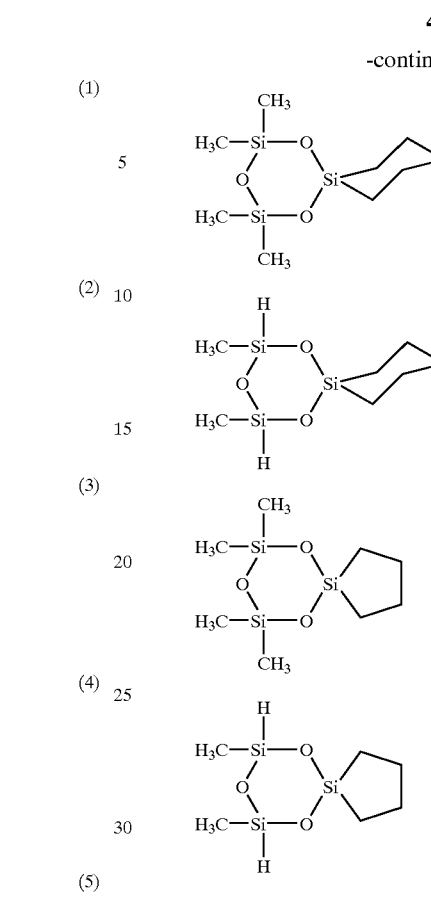

Figure 1 Representative Asymmetric Organocyclosiloxanes

The films that are formed using the above-described substituted organosilane compounds will have dielectric constants, k, of below 2.5, preferably in the range 2.0 to 2.5.

The low-k dielectric films formed by the compounds of the present invention are deposited using pyrolytic or plasma-assisted CVD processes. The siloxane precursor will react or polymerize on the surface of the wafer forming the dielectric layer. The reaction, in part, results in the opening of the cyclic structure and gives better control of organic content and the steric effect of the organic groups in the finished film. Reduction of film density and introduction of nano-pores help to achieve lower k values.

The present invention provides for low-k precursor chemistries and process methods of depositing low-k film using CVD techniques. The process system comprises a precursor delivery manifold system, a vacuum chamber as a plasma CVD reactor, a wafer substrate, and a computer control system.

The low-k precursor of this invention is injected into vacuum chamber with or without a carrier gas. Depending upon the physical properties of a member of the low-k precursor family, either liquid or vapor phase precursor is delivered by a manifold system to the vacuum chamber. The low-k precursor material is placed in a metallic source bubbler. Both pressure and temperature of the bubbler are controlled. For high vapor pressure precursors (>5 Torr at source temperature from 25° C. to 100° C.), a direct vapor delivery method based on a pressure mass flow controller can be employed. Typically, the downstream delivery lines as well as a showerhead in the vacuum chamber are heat traced to avoid any condensation. The precursor can also be delivered using a liquid injection method at room temperature. The liquid phase precursor or solution of solid phase precursor can be injected to a vaporizer where it is located at the vacuum chamber. The vaporizer converts liquid phase precursor into vapor phase precursor at the point-of-use. In either case, the precursor is delivered at a rate from 1 sccm to 1000 sccm by the manifold system.

The low-k precursor family of this invention contains the necessary components for making low-k dielectric layers. These components are atoms of silicon, oxygen, carbon, and hydrogen. Therefore, an individual low-k precursor can be used in low-k deposition methods of the present invention. An additional oxygen-containing precursor, such as $O_2$ or $N_2O$, is optional. The additional oxidant and optional inert carrier gases are delivered using thermal mass flow controllers.

The vacuum chamber is a chemical vapor deposition (CVD) reactor. One viable CVD reactor in which the methods of this invention can be practiced is a parallel plate single wafer reactor. The process can be either pyrolytic or plasma-assisted CVD. The total pressure in the reactor is controlled from 0.01 mTorr to 100 Torr. RF power is applied to the upper electrode or the showerhead. The RF power excites the precursor vapors that have been inputted into the vacuum chamber and generates reactive plasma. The frequency of RF is typically in the range of 1 kHz to 3 GHz. A frequency of 13.56 MHz is typical. The RF power can be varied from 1 to 1000 W. The preferred RF power is from 5 to 100 W. The RF power can be pulsed by alternating between on and off. When the duration of RF power on equals zero, the pyrolytic CVD condition is obtained.

A semiconductor substrate, typically a silicon wafer, is placed onto the bottom electrode. The size of the substrate can be up to 300 mm in diameter. The bottom electrode is heated by either electrical resistance heaters or by radiation heaters. The wafer temperature is controlled from 30° C. to 500° C. The distance from the bottom electrode to the upper electrode can be also varied. Precursors deposited on the hot wafer surface will react and polymerize and this reaction and polymerization is driven by reactive species, thermal and ring strain energies. In this process, the opening and retention of the precursor ring structures of the present invention can be controlled within the low-k films.

A computer system controls the precursor delivery, RF powers, vacuum and pressure in the CVD chamber, as well as the temperature in the delivery manifold and in the reactor.

Low-k films with thickness from 0.5 to 5 microns were characterized for their thermal, mechanical, and electrical properties. The k values were obtained by measuring Aluminum dots MIS capacitance structures at 1 MHz and 0.5–2 Volts.

EXAMPLES

A general synthesis route to asymmetric cyclotrisiloxanes is shown below.

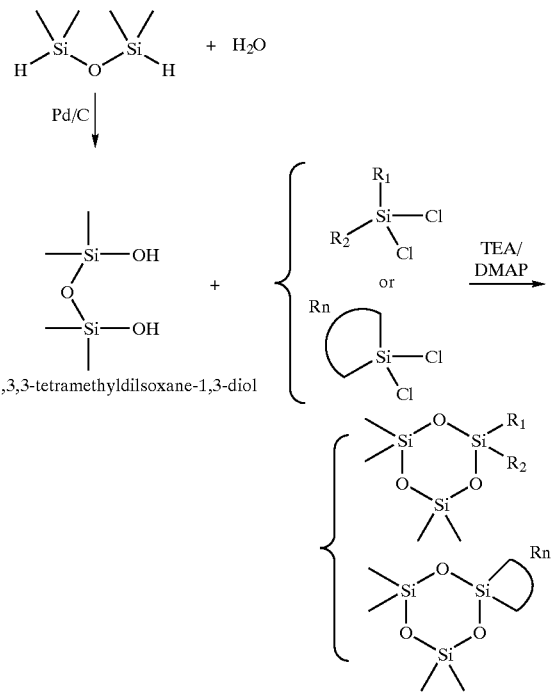

$R_1$ = vinyl, or cyclohexyl
$R_2$ = H, or methyl
$R_n$ = cyclopentamethylene, or cyclotrametylene TEA is triethanolamine
DMAP is 4-dimethylaminopyridine Synthesis of 1,1,3,3-tetramethyldilsoxane-1,3-diol 1,1,3,3-Tetramethyldilsoxane-1,3-diol was synthesized by a procedure described in literature (J. Chojnowski, et al., *Macromolecules* 1996, 29, 2711–2720). In a three necked flask fitted with a dropping funnel, a thermometer, and a condenser were placed 50 mL of dried dioxane, 3.6 g (0.2 mol) of water, and Pd/C, 0.12 g (0.056 mol). The flask was vigorously stirred, and 1,1,3,3-tetramethyldisiloxane, 13.5 g (0.1 mol) was slowly introduced. The temperature was maintained at 40° C. during the disiloxane addition. After the addition, the reaction mixture was stirred at room temperature overnight. Then the mixture was filtered through filter agent, the solvent was removed by rotary evaporation, and the product was obtained as a white crystalline material. The product was further purified by recrystallization from a mixture of diethyl ether and hexane. The yield of pure product after the recrystallization was 50%. $^1$H NMR (200 MHz, Benzene-d6, ppm): δ=0.1 (m, 12H, 4CH$_3$), 1.7 (s, 2H, OH). Elemental analysis: calculated (%): C, 28.8, H, 8.5, Si, 33.8; found: C,28.7, H, 8.8, Si, 33.4. APCI MS (CH$_3$OH as a mobile phase): calculated: 166.0; found: 163.3 [(M−3H)$^+$, 100%], 166.3 [M$^+$, 7%], 167.2 [(M+H)$^+$, 48%]. FT-IR (KBr detector, cm$^{-1}$): 3211.2 (s); 2966.1 (m); 2904.8 (w); 2219.6 (vw); 1953.6 (w); 1730.7 (w); 1590.7 (w); 1407.5 (w); 1257.2 (s); 1031.9 (vs); 906.0 (s); 861.5 (vs); 814.0 (s); 787.6 (vs).

General Synthesis Procedure for Cyclotrisiloxanes

The cyclotrisiloxanes were synthesized by a modified method described in the literature (J. Chojnowski, et al., *Macromolecules* 1996, 29, 2711–2720). In details, 125 mL of 0.3 M solution of a dichlorosilane in ether and 125 mL of 0.3 M solution of 1,1,3,3-tetramethyldilsoxane-1,3-diol in ether were added simultaneously under nitrogen to 250 mL of ether solution containing stoichiometric amount of triethylamine and 10% DMAP. During the addition, the mixture was vigorously stirred and kept at 5–7° C. The stirring was continued while the mixture was allowed to warm up to room temperature in about 2 hours. White precipitate was filtered, and the ether solution was washed with brine following washings with 1.5 M aqueous HCl solution and aqueous sodium bicarbonate solution to reduce pH to neutral. The solution was dried over MgSO$_4$. After the solvent was removed by rotary evaporation, the desired product was obtained. A solvent vacuum transfer to remove volatile impurities was carried out to further purify the product.

2-Vinyl-2,4,4,6,6-pentamethylcyclotrisiloxane

Yield: 89%. $^1$H NMR (200 MHz, Benzene-d6, ppm): δ=0.2 (m, 15H, 5CH$_3$), 5.9 (m, 3H, vinyl). $^{13}$C NMR (50 MHz, Benzene-d6, ppm): δ=0 (CH$_3$), 2.0 (CH$_3$), 137.0 (vinyl carbons). Elemental analysis: calculated (%): C, 35.8, H, 7.7; found: C, 35.3, H, 8.1. APCI MS (CH$_3$OH as a mobile phase): calculated: 234.1; found: 235.1 [M+H$^+$, 100%], 249.3 [(M+CH$_3$OH)$^+$, 30%]. FT-IR (KBr detector, cm$^{-1}$): 1407.4 (w); 1258.4 (m); 1074.5 (m); 1001.5 (vs); 962.3 (w); 857.3 (w); 797.2 (s); 755.0 (m).

Pentamethylcyclotrisiloxane

Yield:70%. $^1$H NMR (200 MHz, Benzene-d6, ppm): δ=0.2 (m, 15H, 5CH$_3$), 4.7 (s, Si—H). Elemental analysis: calculated (%): C, 28.8, H, 7.7; found: C, 28.9, H, 7.9. APCI MS (CH$_3$OH as a mobile phase): calculated: 208.0; found: 223.3 [(M+CH$_3$)$^+$, 100%]. FT-IR (KBr detector, cm$^{-1}$): 2156.4 (w); 1258.4 (m); 1063.5 (s); 1016.4 (s); 907.6 (m); 825.6 (m); 793.8 (vs); 757.4 (m).

2-Cyclohexyl-2,4,4,6,6-pentamethylcyclotrisiloxane

Yield: 96%. $^1$H NMR (200 MHz, Benzene-d6, ppm): δ=0.2 (m, 15H, 5CH$_3$), 0.7 (m, 1H, CH), 1.2 (m, 5H, CH$_2$, e), 1.8 (m, 5H, CH$_2$, a). $^{13}$C NMR (50 MHz, Benzene-d6, ppm): δ=-2.0 (Si—CH$_3$), 2.0 (Si—CH$_3$), 27.0 (m, CH$_2$). Elemental analysis: calculated (%): C, 45.5, H, 9.0, Si, 29.0; found: C, 45.6, H, 8.9, Si, 29.2. APCI MS (CH$_3$OH as a mobile phase): calculated: 290.1; found: 291.0 [M+H$^+$, 2%], 305.4 [(M+CH$_3$)$^+$, 100%]. FT-IR (KBr detector, cm$^{-1}$): 1448.3 (w); 1256.9 (m); 1077.2 (w); 1004.1 (vs); 891.0 (w); 847.6 (w), 800.9 (s); 745.6 (m).

2-Cyclotetramethylene-4,4,6,6-tetramethylcyclotrisiloxane

Yield: 78%. $^1$H NMR (200 MHz, Benzene-d6, ppm): δ=0.2 (m, 12H, 4CH$_3$), 0.5 (m, 4H, Si—CH$_2$), 1.5 (m, 4H, CH$_2$). $^{13}$C NMR (50 MHz, Benzene-d6, ppm): δ=1 (Si—CH$_3$), 16 (CH$_2$), 25 (CH$_2$). Elemental analysis: calculated (%): C, 38.7, H, 8.1; found: C, 38.2, H, 8.5. APCI MS (CH$_3$OH as a mobile phase): calculated: 248.1; found: 263.5 [(M+CH$_3$)$^+$, 100%]. FT-IR (KBr detector, cm$^{-1}$): 1407.1 (w); 1258.2 (m); 1059.6 (s); 1008.7 (vs); 847.6 (m); 793.4 (vs), 695.6 (m).

Characterization of 2-cyclotrimethylene-4,4,6,6-tetramethylcyclotrisiloxane produced by this method revealed that it exists as a dimer.

Yield: 88%. $^1$H NMR (200 MHz, Benzene-d6, ppm): δ=0.1 (m, 12H, 4CH$_3$), 1.4 (m, 4H, 2CH$_2$), 1.6 (2H, CH$_2$). APCI MS (CH$_3$OH as a mobile phase): calculated: 234.1; found: 501.3 [(dimer+2CH$_3$)$^+$, 100%]. FT-IR (KBr detector, cm$^{-1}$): 1409.9 (w); 1258.8 (m); 1128.9 (m); 1012.2 (s); 913.9 (w); 792.8 (vs); 707.6 (m).

Vapor Pressure Curves of Low-k CVD Precursors

A vapor pressure tool was constructed to measure low-k CVD precursors. The temperature range of the measurement was between −10° C. to 150° C. and the pressure range was between 0 and 100 Torr. Experimental results for 2-vinyl-2,4,4,6,6-pentamethylcyclotrisiloxane are detailed in the Graph 1 below.

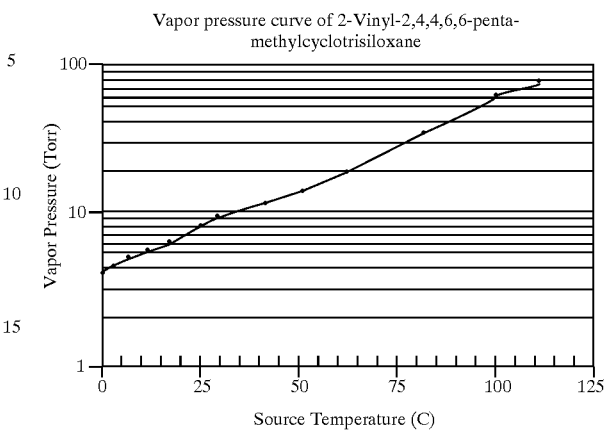

Graph 1

Vapor pressure curve of 2-Vinyl-2,4,4,6,6-pentamethylcyclotrisiloxane

Low-k Film With 2-vinyl-2,4,4,6,6-pentamethylcyclotrisiloxane Without Any Oxidants Precursor source temperature was maintained at 50° C. It was delivered using a pressure based mass flow controller at a constant temperature of 60° C. (MKS model 1150) without any carrier gases. The low-k source flow rate varied from 2 to 10 sccm in a design of experiment. The low-k precursor was injected into argon plasma near the wafer surface in a PECVD reactor (SemiGroup PECVD). An internal injection gas ring was used for improving film uniformity. In the design of experiment, the wafer temperature 30° C.–100° C., argon purge flow rate 25–100 sccm, RF power 5–25 W, chamber pressure 150–500 mTorr. Higher film growth rates were found in lower deposition temperature and higher plasma power. The refractive index and thickness were measured using a prism coupler (Metricon model 2010). The growth rate was from 1 to 10 Å/sec in our tool. The refractive index (n) was between 1.44 and 1.46. After the optical screening, an array of Aluminum dots was deposited on the top of low-k films with shadow masks in a large e-beam evaporation system (CHA Mark 50). In each metal run, a batch of 25 wafers, that included three thermal oxide calibration wafers, was processed at the same time. The capacitance of the MIS structures was measured at 1 MHz and 0.5–2 Volts (MDC model 1600). The film dielectric constants of the low-k films were found from 1.98 to 2.30. Some low-k films were annealed at 380° C. and 150 mTorr in argon for 2–4 hours. No large changes in n and k values observed.

| Film composition measured by XPS method excluded hydrogen atom. | | | |
|---|---|---|---|
| 2-vinyl-2,4,4,6,6-pentamethylcyclotrisiloxane low-k CVD film | C (at. %) | O (at. %) | Si (at. %) |
| Precursor | 53.8 | 23.1 | 23.1 |
| Deposited film | 47.5 | 21.2 | 31.3 |
| Annealed film | 47.1 | 21.3 | 31.6 |

| Film thermal stability measured by TGA method. | | |
|---|---|---|
| 2-vinyl-2,4,4,6,6-pentamethylcyclotrisiloxane low-k CVD film | Rate of loss at 350° C. (%/hr) | Total loss at 700° C. (%) |
| Deposited film | 0.0008 | 0.026 |
| Annealed film | 0.0008 | 0.019 |

To deposit the low-k film, either pyrolytic or plasma enhanced CVD can be used. Film dielectric constants as low as 2.0 can be achieved using a single precursor of this invention without an oxidant precursor.

While this invention has been described with respect to particular embodiments thereof, it is apparent that numerous other forms and modifications of the invention will be obvious to those skilled in the art. The appended claims and this invention generally should be construed to cover all such obvious forms and modifications which are within the true spirit and scope of the present invention.

Having thus described the invention, what we claim is:

1. A method for fabricating a dielectric film having a k value of 3.5 or below on a semiconductor or integrated circuit surface comprising applying to said surface an asymmetric organocyclosiloxane compound, wherein said compound reacts with and deposits on said surface.

2. The method as claimed in claim 1 wherein said asymmetric organocyclosiloxane compound has the formula:

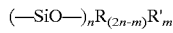

$$(-SiO-)_n R_{(2n-m)} R'_m$$

wherein (—SiO—) is a cyclic siloxane ring; n is 3 or higher; R is an acyclic alkyl-containing hydrocarbon from $C_1$ to $C_7$; R' is H, a vinyl group, or a cyclohexyl group; and m is 1 or greater with the proviso that the resulting compound remains asymmetric.

3. The method as claimed in claim 2 wherein R and R' are linked together to form a cyclic alkyl group.

4. The method as claimed in claim 2 wherein said asymmetric organocyclosiloxane compound is selected from the group consisting of 2-vinyl-2,4,4,6,6-pentamethylcyclotrisiloxane, 2-vinyl-4,4,6,6-tetramethylcyclotrisiloxane, 2-vinyl-2,4,6-trimethylcyclotrisiloxane, 2-vinyl-4,6-dimethylcyclotrisiloxane, 2,6-divinyl-4,4-dimethylcyclotrisiloxane, 2,6-divinyl-4-methylcyclotrisiloxane, 2-cyclohexyl-2,4,4,6,6-pentamethylcyclotrisiloxane, 2-cyclohexyl-4,6-dimethylcyclotrisiloxane, 2-cyclopentamethylene-4,4,6,6-tetramethyltrisiloxane, 2-cyclopentamethylene-4,6-dimethyltrisiloxane, 2-cyclotetramethylene-4,4,6,6-tetramethyltrisiloxane, and 2-cyclotetramethylene-4,6-dimethyltrisiloxane.

5. The method as claimed in claim 1 wherein said dielectric film has a k value below 2.5.

6. The method as claimed in claim 4 wherein said dielectric film has a k value in the range of about 2.0 to about 2.5.

7. The method as claimed in claim 1 wherein said asymmetric organocyclosiloxane compound precursor is deposited on the surface of the semiconductor or integrated circuit using chemical vapor deposition.

8. The method as claimed in claim 6 wherein said chemical vapor deposition is pyrolitic or plasma-assisted.

9. The method as claimed in claim 7 wherein said precursor is in either the vapor phase or the liquid phase prior to deposition.

10. The method as claimed in claim 7 wherein said precursor is a single precursor that contains silicon, carbon, oxygen, and hydrogen atoms.

11. The method as claimed in claim 1 further comprising applying said precursor with a purge or plasma gas.

12. The method as claimed in claim 1 where said surface is no more than 300 millimeters in diameter.

13. The method as claimed in claim 1 further applying an oxygen-containing precursor to said surface.

14. The method as claimed in claim 13 wherein said oxygen-containing precursor is $O_2$ or $N_2O$.

15. A method for fabricating a dielectric film having a k value of 3.5 or below on a semiconductor or integrated circuit surface comprising applying to said surface 2-vinyl-2,4,4,6,6-pentamethylcyclotrisiloxane, wherein said 2-vinyl-2,4,4,6,6-pentamethylcyclotrisiloxane reacts with and deposits on said surface.

16. The method as claimed in claim 15 wherein said dielectric film has a k value below 2.5.

17. The method as claimed in claim 16 wherein said dielectric film has a k value in the range of about 2.0 to about 2.5.

18. The method as claimed in claim 15 wherein said 2-vinyl-2,4,4,6,6-pentamethylcyclotrisiloxane is deposited on the surface of the semiconductor or integrated circuit using chemical vapor deposition.

19. The method as claimed in claim 18 wherein said chemical vapor deposition is pyrolitic or plasma-assisted.

* * * * *